United States Patent [19]

Blickensderfer

[11] 4,290,877

[45] Sep. 22, 1981

[54] SPUTTERING APPARATUS FOR COATING ELONGATED TUBES AND STRIPS

[75] Inventor: Robert Blickensderfer, Albany, Oreg.

[73] Assignee: The United States of America as represented by the Secretary of the Interior, Washington, D.C.

[21] Appl. No.: 184,852

[22] Filed: Sep. 8, 1980

[51] Int. Cl.³ ............................................. C23C 15/00
[52] U.S. Cl. .................................. 204/298; 204/192R
[58] Field of Search ................ 204/192 R, 192 C, 298

[56] References Cited

U.S. PATENT DOCUMENTS

| | | | |
|---|---|---|---|
| 3,884,787 | 5/1975 | Kuehnle | 204/192 |
| 3,884,793 | 5/1975 | Penfold et al. | 204/298 |
| 3,901,784 | 8/1975 | Quinn et al. | 204/192 |
| 3,945,903 | 5/1976 | Svendor et al. | 204/192 |
| 4,046,712 | 9/1977 | Cairns et al. | 252/447 |
| 4,128,466 | 12/1978 | Harding et al. | 204/192 C |
| 4,151,064 | 4/1979 | Kuehnle | 204/298 |
| 4,194,962 | 5/1980 | Chambers et al. | 204/298 |
| 4,252,865 | 2/1981 | Gilbert et al. | 428/611 |

FOREIGN PATENT DOCUMENTS 1147318 4/1969 United Kingdom ................ 204/298

OTHER PUBLICATIONS

G.L. Harding et al. "The DC Sputter Coating of Solar-Selective Surfaces Onto Tubes", *J. Vac. Sci. Technol.*, vol. 13, pp.1073–1075 (1976).

*Primary Examiner*—Aaron Weisstuch
*Attorney, Agent, or Firm*—William S. Brown; Donald A. Gardiner

[57] ABSTRACT

A conventional sputtering chamber is modified to include two elongated hollow tubes which accommodate an elongated workpiece in the form of a tube or strip, of lesser diameter, during a sputter-coating operation. During the sputtering operation, the workpiece is simultaneously rotated and moved back and forth beneath at least one sputtering target to receive a uniform coating thereon.

5 Claims, 2 Drawing Figures

SPUTTERING APPARATUS FOR COATING ELONGATED TUBES AND STRIPS

BACKGROUND OF THE INVENTION

1. Field of the Invention

This invention relates to a method and apparatus for coating elongated tubes and strips by sputtering.

2. Description of the Prior Art

Typical commercial sputtering equipment using flat-circular sputtering targets can neither accomodate nor sputter a uniform coating onto a tubular workpiece, especially elongated workpieces.

An apparatus for reactively sputtering onto tubes was recently described in an article by Harding et al. in the Journal of Vacuum Science Technology, Vol. 13, No. 5, page 1073, (1976). The apparatus in this article deposits a coating along the full length of a rotating tubular workpiece, but a full-length rod cathode or a cathode equivalent to the length of the rotating workpiece was required. The lack of uniformity of the coating along the length of the rotating workpiece is mentioned as a problem in this article.

SUMMARY OF THE INVENTION

It is an object of this invention to sputter-coat elongated tubes and strips without increasing the size of the sputtering target or cathode in the sputtering chamber.

In the apparatus of this invention, the workpiece is moved in the direction of its length beneath a conventional disk cathode or target, and, in the case of a tubular workpiece, is simultaneously rotated. To accommodate elongated workpieces, two horizontal tubes (150 cm long×13 cm in diameter) are added on opposite sides of the cylindrical sputtering chamber. The tubes are attached to the chamber such that the workpiece is passed under two sputtering targets during a sputtering operation. Consequently, the workpiece can be coated with a first target material and then with a second material without opening the vacuum chamber containing the targets and the workpiece.

BRIEF DESCRIPTION OF THE DRAWINGS

Various other objects, features and attendant advantages of the present invention will be more fully appreciated as the same becomes better understood from the following detailed description when considered in connection with the accompanying drawings, wherein like reference characters designate like or corresponding parts throughout the several views, and wherein.

DETAILED DESCRIPTION OF THE PREFERRED EMBODIMENTS

Figure 1:
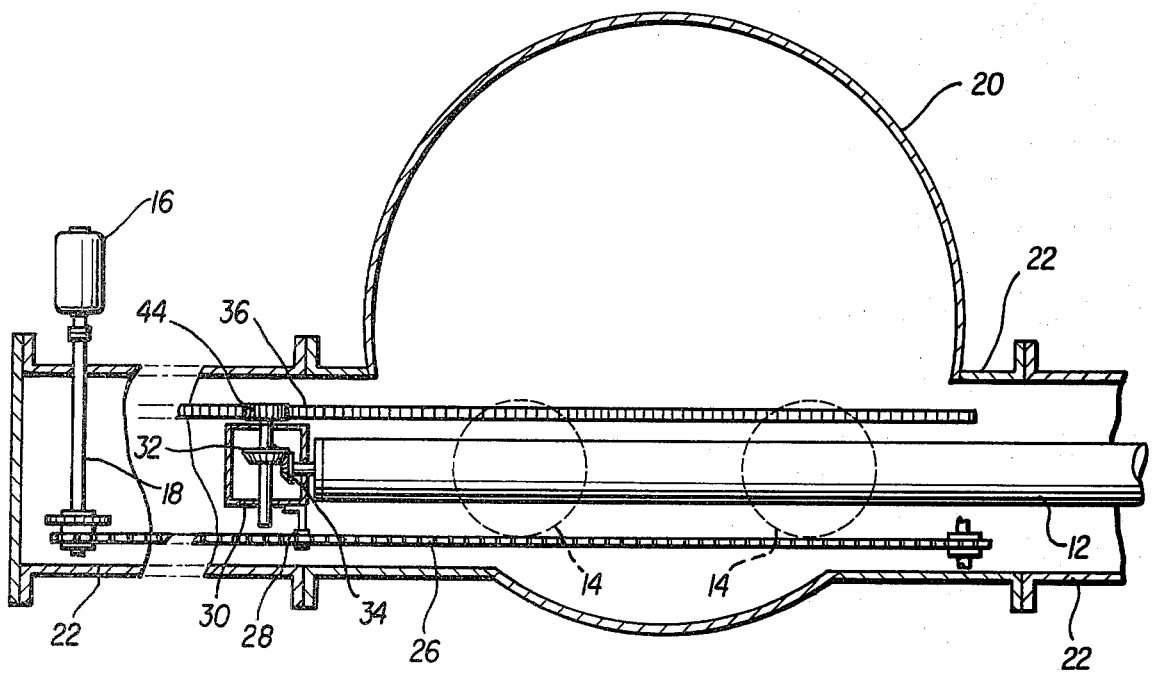
FIG. 1 is a diagrammatic and sectioned top-view of a sputtering chamber which includes the improved portion of this invention.

The mechanism for rotating the tubular workpiece 12, while moving it beneath the sputtering targets 14, is disclosed in FIG. 1. An external electric motor 16, connected to a multipleratio gear box, turns a shaft 18 which extends through a lubricated packing gland in the tube wall into the vacuum sputtering chamber 20. The remainder of the mechanism for rotating and transporting the workpiece 12 is located inside the extension tubes 22, as shown in FIG. 1.

Figure 2:
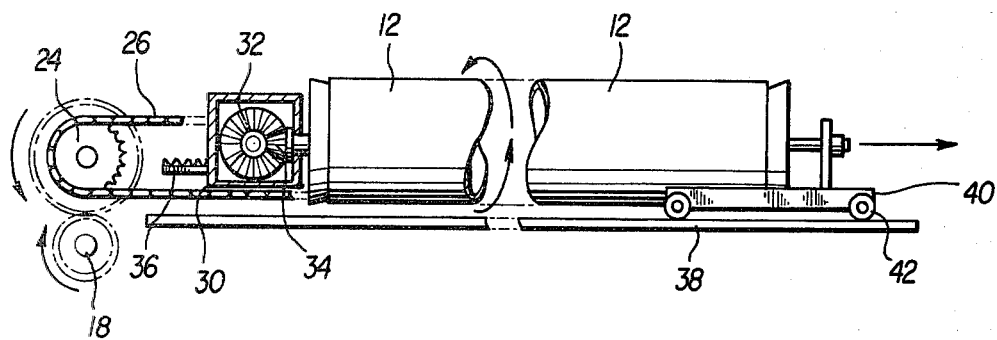
FIG. 2 is a diagrammatic and sectioned front-view of the sputtering apparatus shown in FIG. 1.

A sprocket 24, driven by the rotating shaft 18, drives an endless chain 26 which supports a dog 28 for engaging a carriage 30 with pinions 32 and 34. The carriage 30 travels on two racks 36 attached to a base plate 38 as seen in FIG. 2. The carriage 30 supports one end of the workpiece 12. A second carriage 40, as seen in FIG. 2, with wheels 42 that run between the two racks 36, supports the other end of the workpiece 12. The movement of the first carriage 30 and the workpiece 12 relative to the fixed racks 36 drives a pinion 44 the teeth of which mesh with the teeth of the rack 36. The pinion 44 is drivingly connected to pinion 32 and causes the rotation thereof to thereby rotate the workpiece 12. The gear ratios of pinions 32, 34 and 44 and the teeth on racks 36 provide one revolution of the workpiece 12 per 3 cm of travel.

When only simple translation and no rotation of the workpiece 12 is desired, (e.g., coating a flat strip), a sled-type carriage running between the racks is substituted for the geared carriage 30. The carriage 30 can be driven at speeds of 1, 2, 5 or 10 cm per minute.

After pumping the chamber 20 to a pressure of $10^{-6}$ torr, then throttling, and admitting argon gas to achieve a steady state pressure of $10^{-2}$ torr, sputtering is started. The argon gas for the sputtering plasma is admitted through a micrometer needle valve (not shown) at one side of the chamber 20. For reactive sputtering, a second gas (e.g., nitrogen or oxygen) is admitted through another micrometer needle valve (not shown) in a stream in contraposition to the argon gas flow such that thorough mixing occurs.

In an example of the operation of the foregoing apparatus of this invention, a plurality of elongated and flat specimens were coated by sputtering. For example, copper strips 7-cm wide and approximately 152-cm long were sputtered with silver followed by a coating of zirconium carbonitride produced by reactively sputtering zirconium carbide in $1.2 \times 10^{-4}$ torr nitrogen. The strips were given a forward speed of 10 cm/min at a power input of 400 watts on an 8-in silver target to obtain a film 1500 Å thick. A slower forward speed of 2 cm/min and a power input of 230 watts on a 5-in zirconium carbide target was used to reactively sputter 1200 Å thickness of zirconium carbonitride.

As is characteristic of this type of selective absorptive film, interference phenomena allow small differences in optical thickness to be seen readily as color differences. The resulting films on the strips were observed in the foregoing examples to be uniform in color over the entire width and length of the strips. Based on thickness measurements made with an interference microscope on coatings sputtered on stationary specimens, it is estimated that any variation of film thickness on the elongated strips was less than 100 Å.

In addition, a 2.5-cm diameter aluminum tube, 30-cm in length, was coated with silver followed by a coat of zirconium carbonitride. The speed of movement of the rotating tube and the power input were both changed to give the same coating thickness as on the copper strips. Again, the uniformity of the coating both around and along the length of the tube was indicated by the uniform color of the film.

The foregoing demonstrates that conventional sputtering equipment utilizing flat sputtering targets can be adapted to produce uniform coatings on elongated strips and tubes by modifying the equipment in the above-described manner.

Obviously, many modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. Apparatus for sputter-coating a layer of uniform thickness onto the surface of an elongated workpiece, comprising:

a sputtering chamber with at least one disk-shaped cathode located therein;

means attached to said sputtering chamber for accommodating the entire length of said elongated workpiece; said means for accommodating said workpiece being greater in length than said vacuum chamber and locating a portion of said workpiece adjacent said at least one disk-shaped cathode;

means for forming a sputtering plasma in said sputtering chamber; and means located within said accommodating means for simultaneously rotating said workpiece while moving said workpiece along the length of said accommodating means and past said at least one disk-shaped cathode during a sputtering operation to deposit a coating of uniform thickness on said elongated workpiece.

2. The sputter-coating apparatus of claim 1 wherein said accommodating means is comprised of at least two elongated hollow tubes placed on opposite sides of said sputtering chamber and being attached to said sputtering chamber so that said elongated workpiece can travel in a straight line from one of said at least two hollow tubes, through said sputtering chamber and into the other of said at least two hollow tubes during the sputtering operation.

3. The sputter-coating apparatus of claim 2 wherein said sputter-coating apparatus can sputter-coat a workpiece substantially equal in length to the length of one of said at least two hollow tubes.

4. The sputter-coating apparatus of claim 1 wherein said means for simultaneously rotating and moving said workpiece includes a chain mechanism for moving said workpiece through said sputtering chamber and a rack and pinion mechanism operating in response to the movement of said chain mechanism to rotate said workpiece.

5. The sputter-coating apparatus of claim 1 wherein a cathode of another material that differs from the material of said at least one cathode is located within said sputtering chamber and a gas capable of reacting therewith is admitted to said sputtering chamber for a reactive sputtering operation.

* * * * *